United States Patent
Murray

(10) Patent No.: US 6,826,734 B1
(45) Date of Patent: Nov. 30, 2004

(54) ARCHITECTURE FOR PROGRAMMABLE ON-CHIP TERMINATION

(75) Inventor: Kenelm G. Murray, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 423 days.

(21) Appl. No.: 10/102,256
(22) Filed: Mar. 19, 2002
(51) Int. Cl.⁷ .............................................. G06F 17/50
(52) U.S. Cl. ..................... 716/4; 716/1; 716/5; 326/30
(58) Field of Search ...................... 716/4, 5, 1; 326/30

(56) References Cited

U.S. PATENT DOCUMENTS

| | | | |
|---|---|---|---|
| 6,414,512 B1 * | 7/2002 | Moyer ......................... | 326/30 |
| 6,418,500 B1 * | 7/2002 | Gai et al. .................... | 710/305 |
| 6,509,765 B1 * | 1/2003 | Drost .......................... | 327/112 |
| 6,586,964 B1 * | 7/2003 | Kent et al. ..................... | 326/30 |
| 6,710,618 B1 * | 3/2004 | Murray ........................ | 326/30 |

* cited by examiner

*Primary Examiner*—Matthew Smith
*Assistant Examiner*—Brandon Bowers
(74) *Attorney, Agent, or Firm*—Marger Johnson & McCollom, PC

(57) ABSTRACT

The present invention provides a programmable on-chip resistance. An apparatus of the present invention may utilize an analog scheme and adjusts the termination resistance in real-time. One way of implementing the invention is the use of a single transistor with analog control that may vary the resistance for differential input ports. This may provide a reduction in parasitic capacitance as viewed by a high-speed driver while reducing the requirement of over-driving the gate to reduce the impedance of the transistor.

15 Claims, 8 Drawing Sheets

ARCHITECTURE FOR PROGRAMMABLE ON-CHIP TERMINATION

FIELD OF THE INVENTION

The present invention relates generally to on-chip termination resistors and more specifically to a programmable on-chip termination resistance.

BACKGROUND OF THE INVENTION

The Low Voltage Differential Swing (LVDS) standard provides a data interface that has a balance I/O buffer driver that sends data by current signaling in a balanced interconnect environment. LVDS is adapted for high-speed transmission of binary data over copper. An advantageous aspect of LVDS is provided due to the response of LVDS receivers to differential voltages, thus LVDS receivers are fairly immune to noise and emit less electromagnetic interference (EMI) than other data transmission standards.

A problem associated with LVDS compliant interfaces is a requirement of a precise line termination resistance. A line termination resistance, fabricated according to various methods, is typically placed in front of a LVDS receiver to maintain signal quality and integrity. LVDS circuits must provide buffers to ensure a signal current of typically 4.0 milliAmperes on a voltage drop across the on-chip resistance from of typically 400 milliVolts. In order to provide a resistor termination to an LVDS transmission line that does not suffer symmetrical signal distortion, an on-chip resistance must be of a chosen value and remain within a desired tolerance. The chosen value for the termination resistor may be required to be between 50 Ohms and 150 Ohms to suit the characteristic impedance of the media with a tolerance of ±10%. However, due to temperature and technology variations, an on-chip resistance may vary as much as 30%. Consequently, a programmable on-chip resistance capable of being set to a desired nominal value and capable of adjusting to accommodate process and temperature variations is desirable.

SUMMARY OF THE INVENTION

Accordingly, the present invention is directed to a method and apparatus for producing a programmable on-chip resistance. In an embodiment of the invention, a programmable on-chip resistance may be produced based upon an external resistor and is implemented through an analog scheme. The apparatus and method of the present invention may provide a termination resistance that may be adjustable in real-time. An advantageous aspect of the present invention is the ability to minimize parasitic capacitance as seen by a high-speed driver sending data to differential input ports. In one embodiment of the invention, the termination resistance located on-chip may be implemented through a single transistor with an analog control.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made to a presently preferred embodiments of the invention, examples of which are illustrated in the accompanying drawings.

Figure 1:
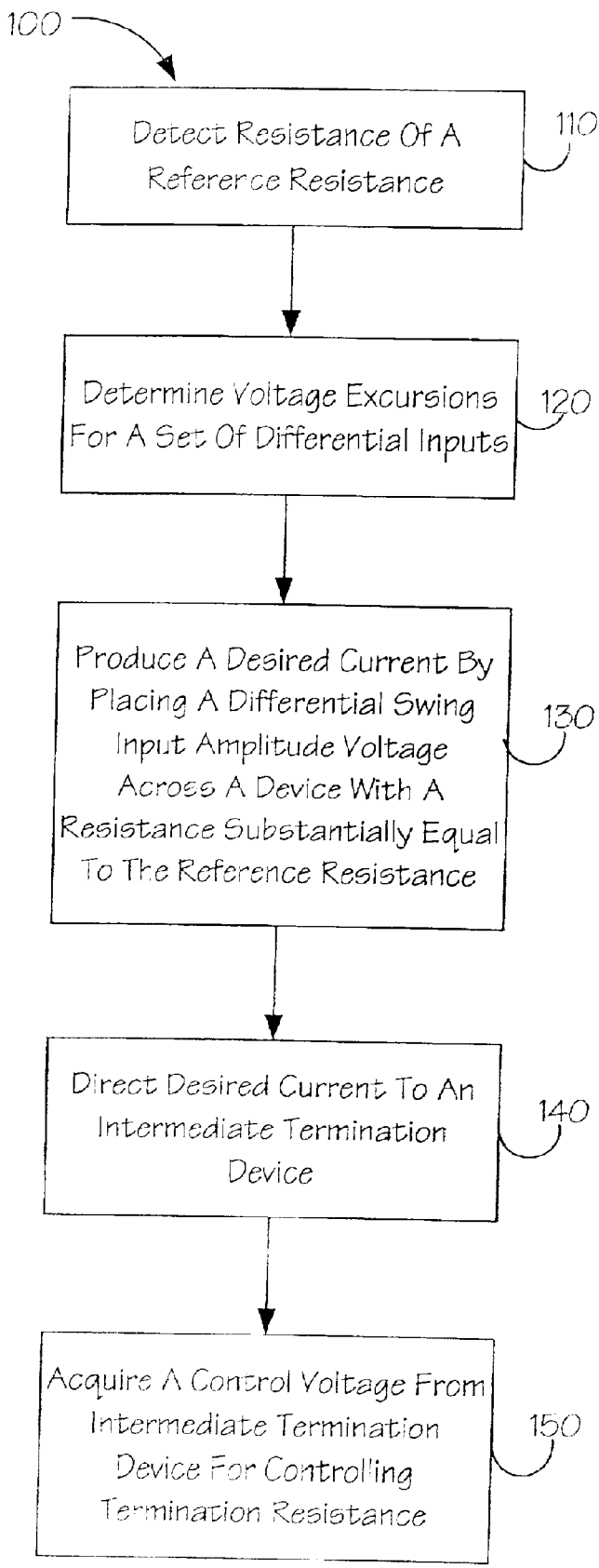
FIG. 1 depicts an exemplary process for producing a programmable on-chip resistance according to an embodiment of the present invention.

Referring to FIG. 1, an exemplary process 100 for producing a programmable on-chip resistance according to an embodiment of the present invention is shown. In one embodiment, process 100 may produce a desirable on-chip resistance. In one embodiment of the invention, the on-chip resistance may be substantially equal to the resistance of a reference resistance, such as a resistor located off the chip. In alternative embodiments, reference resistance may be produced by various devices such as transistors and may be placed off the chip, on the chip, and in the same package as the circuitry for the present invention. Process 100 may begin by detecting the resistance of a reference resistance 110. This may be accomplished in many ways including the measuring of a current through a reference resistance generated by a known voltage.

Process 100 may be utilized to provide a termination resistance for differential inputs of a LVDS compliant interface. A set of differential inputs may be monitored to determine a positive and negative voltage excursion of the set of differential inputs 120. The negative voltage excursion may be subtracted from the positive voltage excursion to produce a differential input swing amplitude voltage. A desired current may be produced by placing the differential input swing amplitude voltage across a device with a resistance substantially equal to the reference resistance 130. The device may be the resistance replicated on the chip, or in an alternative embodiment, may be the reference resistance itself. The desired current produced through the reference resistance may be directed, or in an alternative embodiment manipulated, and fed to an intermediate termination device 140.

The intermediate termination device may receive the desired current and the positive and negative voltage excursions to produce a control voltage. A control voltage, acquired from the intermediate termination device, may be utilized to control the resistance of a termination resistance for the differential inputs 150. The termination resistance produced may be substantially equal to the resistance of the reference resistance, located for example off the chip. In one embodiment of the invention, the termination resistance may be provided by a transistor.

Figure 2:
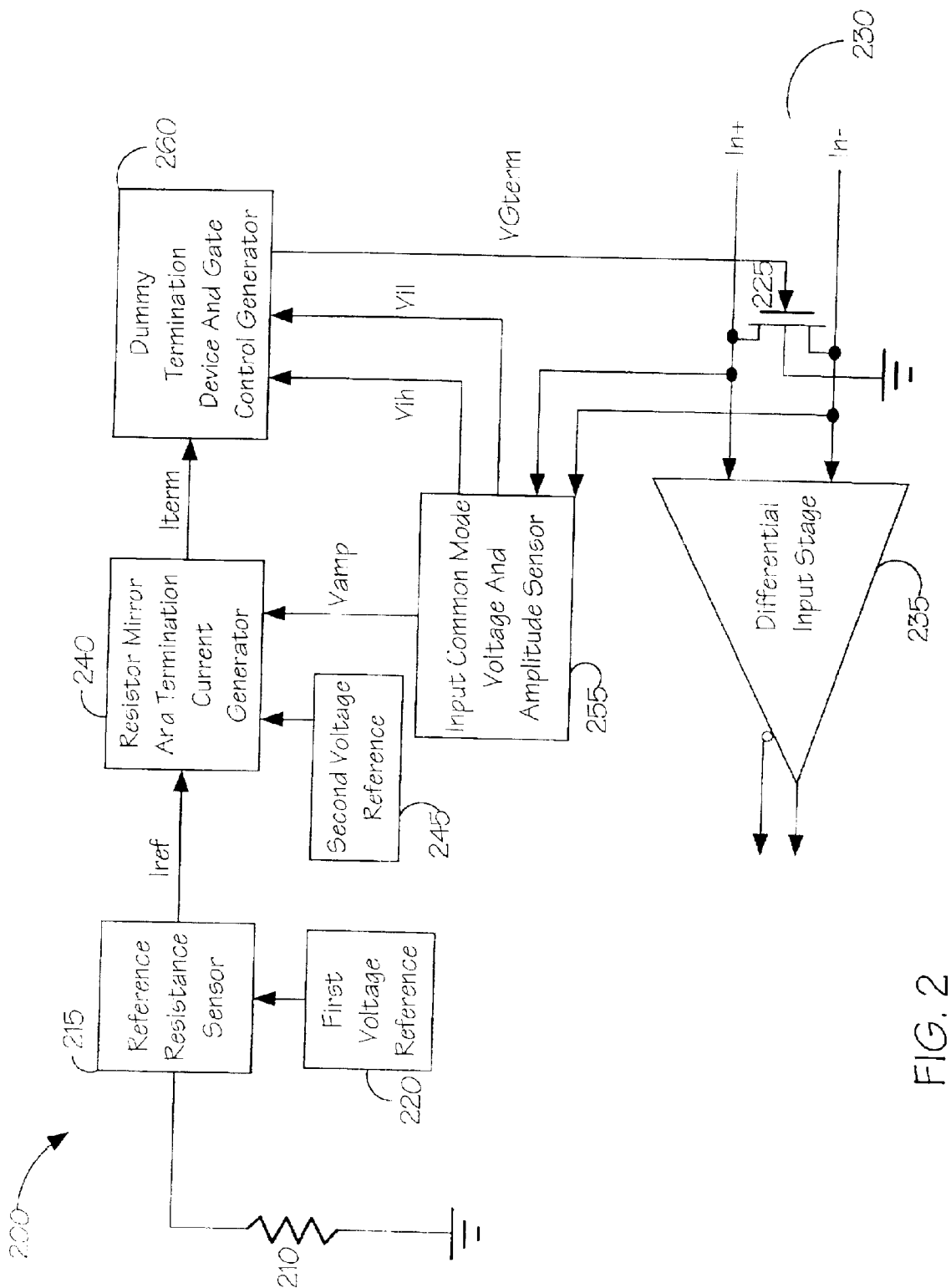
FIG. 2 depicts an exemplary embodiment of the apparatus of the present invention for producing a programmable on-chip resistance.

Referring now to FIG. 2, an exemplary embodiment of an apparatus 200 for providing a programmable on-chip resistance in accordance with the present invention is shown. In one embodiment of the invention, apparatus 200 may perform process 100 of FIG. 1 to provide a programmable on-chip termination resistance. Apparatus 200 may include a reference resistance sensor 215 that may detect the resistance of an reference resistance 210. Reference resistance 210 may be a highly precise resistor with a minimal tolerance. Further, external reference resistor may have a nominal value selected to match the termination requirements of a variety of transmission media with a set of different characteristic impedances. Reference resistance sensor 215 may establish a voltage from a first voltage reference 220 across the external reference resistor 210 to provide a reference current (Iref in FIG. 2). It should be understood by those with ordinary skill in the art that reference resistance 210 may be produced in various fashions and various methods of detecting the resistance of reference resistance 210 by a reference resistance sensor 215 may be employed without departing from the scope and spirit of the present invention.

Current Iref may be delivered to resistor mirror termination current generator 240. Resistor mirror termination current generator 240 may produce a current (Iterm on FIG. 2) from a second voltage reference 245 and a voltage named Vamp produced from an input common mode voltage and amplitude sensor 255. A dummy termination device and gate control generator 260 may provide a voltage reference control (VGterm in FIG. 2) for transistor 225 that provides a termination resistance for differential inputs 230.

Dummy termination device and gate control generator 260 has current Iterm from resistor mirror termination current generator 240 applied through the device and receives a detected high and low extreme voltage levels (Vih and Vil on FIG. 2) of the external differential inputs. Dummy termination device 260 may be an example, and one embodiment of, intermediate termination device of FIG. 1. A resistance of approximately the same value as reference resistance 210 may be produced by transistor 225 between the differential inputs 230 and differential input stage 235. In one embodiment of the invention, the termination resistance is implemented with a single n channel MOS transistor with an analog gate control. This may be advantageous as this may minimize the parasitic capacitance as seen by a high-speed driver sending data to the differential input ports. Apparatus 200 may employ current sources to transport resistor information across device dimensions. This may be advantageous as current sources may be less prone to noise effects than voltage bias schemes.

Another advantageous aspect of an embodiment of the apparatus 200 for providing a programmable on-chip resistance is the ability to implement an analog scheme. Digital schemes known to the art using multiple selectable devices as switches heavily load a high-speed network. However, an analog scheme may not require any special high-speed performance and may provide ease in implementation with regard to amplifier stability and over-voltage generation. Further, an analog scheme may not require specialized accurate control of an input termination resistance and may allow for ease of implementation with regard to on-chip component mismatch and input off-sets.

Figure 3:
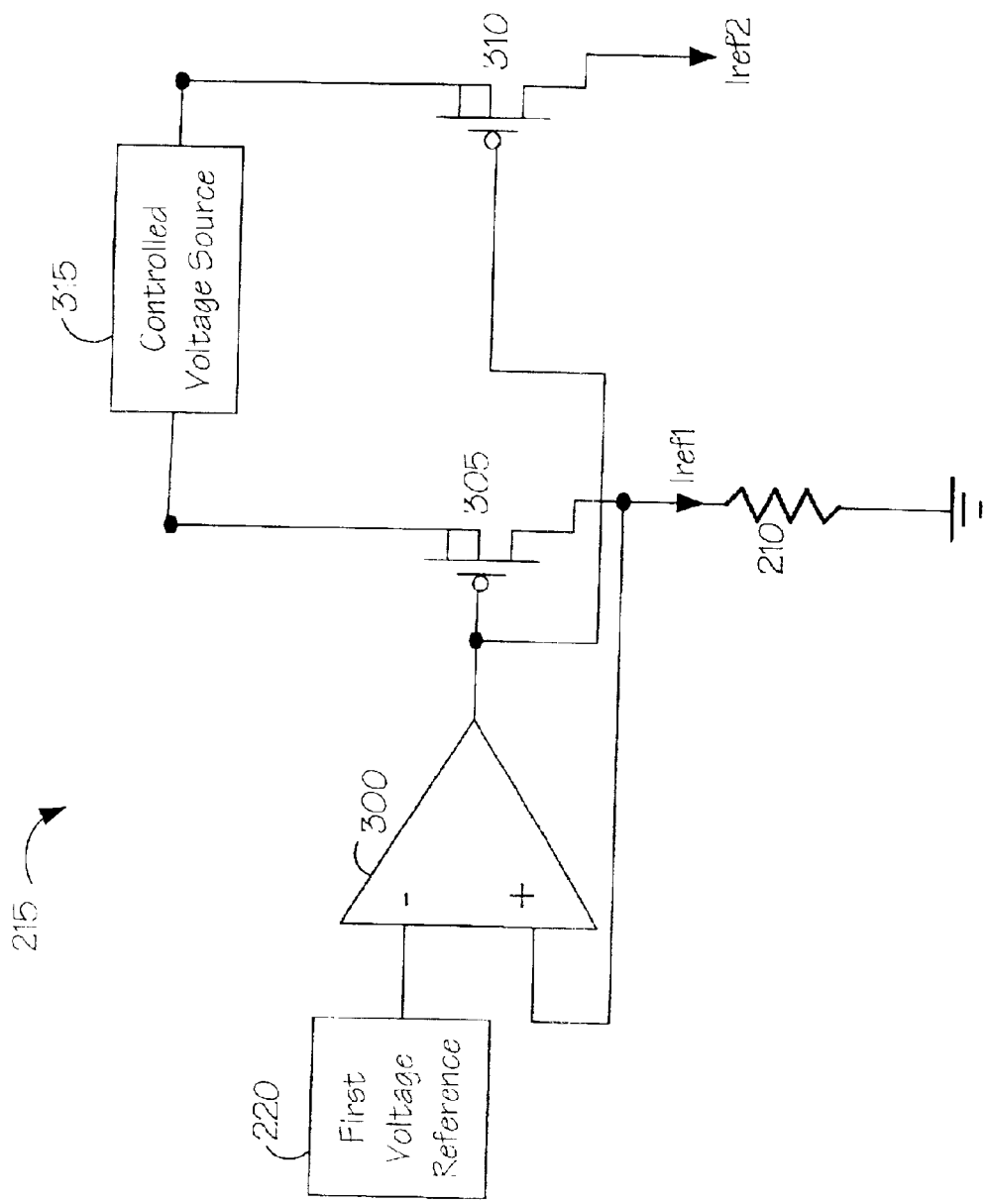
FIG. 3 depicts an exemplary embodiment of an external reference resistor sensor of the present invention.

Referring to FIG. 3, an exemplary embodiment of an reference resistance sensor 215 of the present invention is shown. Reference resistance sensor 215 may employ an amplifier 300 that utilizes a first voltage reference 220 to obtain a measure of current (Iref1 on FIG. 2) from the collector of transistor 305. Current Iref1 may be mirrored from transistor 305 to transistor 310 to produce a current Irej2. In one embodiment of the invention, Irej2 may be routed across the apparatus 200 to the vicinity of the differential input stage 235 of FIG. 2. A controlled voltage source 315 may be coupled to transistors 305 and 310. In one embodiment of the invention, transistors 305 and 310 are p-channel MOS devices. In an alternative embodiments, n channel MOS devices, CMOS devices, and bipolar junction transistors may be employed in accordance with the reference resistance sensor 215 of the present invention to produce a current Irej2. It should be understood by those with ordinary skill in the art that other types of reference resistance sensors may be employed to detect the resistance of a resistor or other type of device with a resistance without departing from the scope and spirit of the present invention.

Figure 4A:
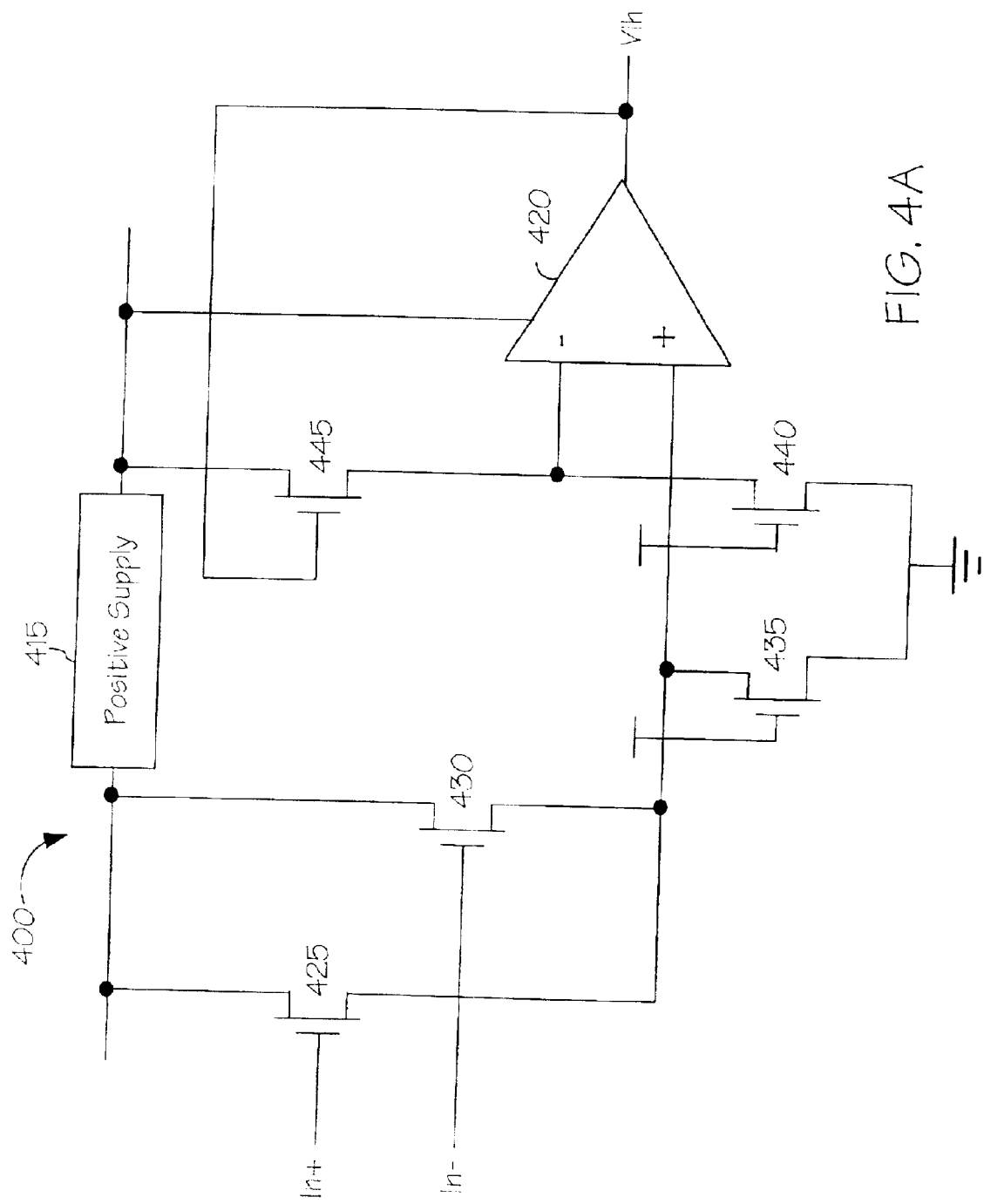
FIG. 4A depicts an exemplary embodiment of circuitry for producing a positive voltage excursion in accordance with the present invention.
Figure 4B:
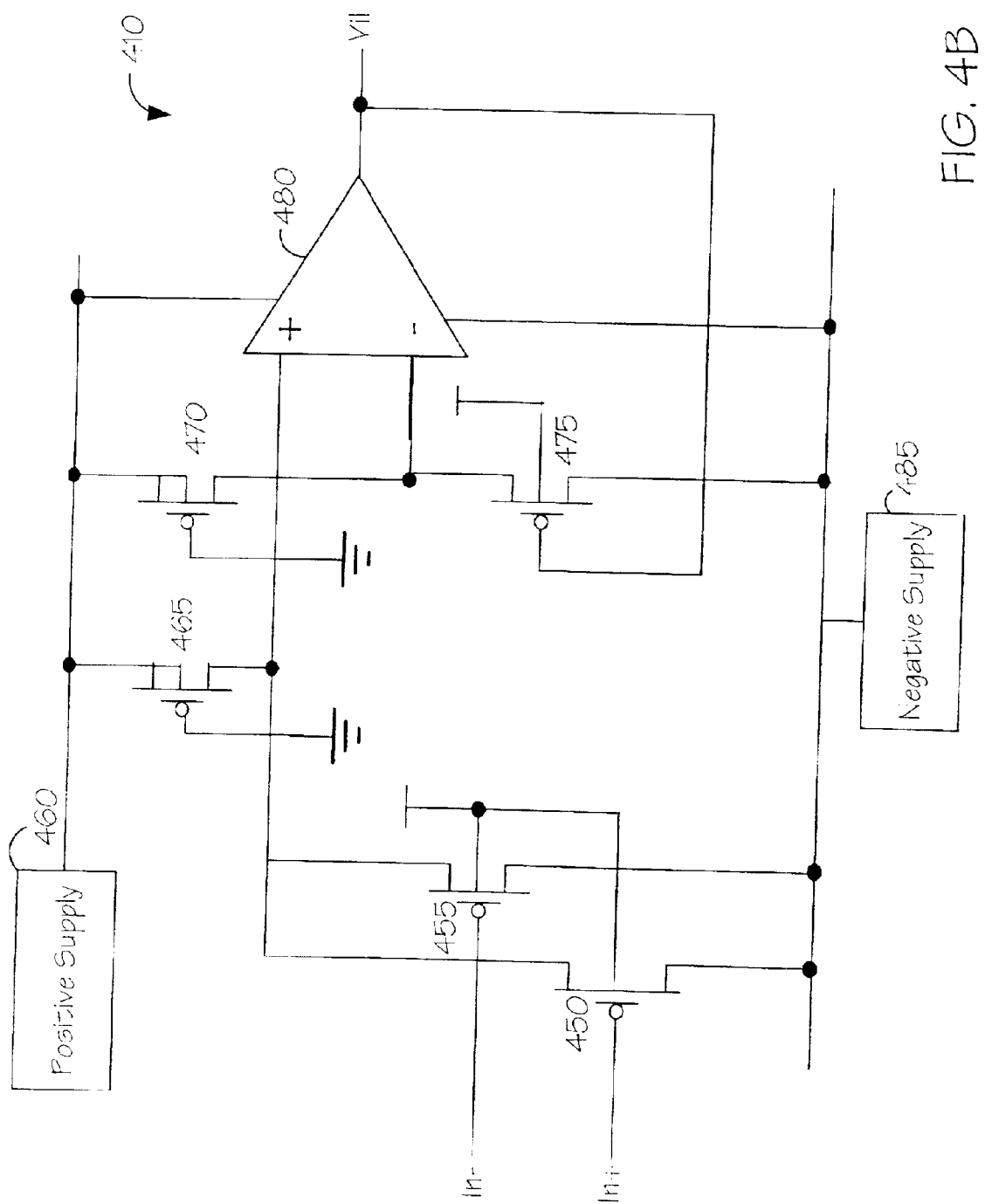
FIG. 4B depicts an exemplary embodiment of circuitry for producing a negative voltage excursion in accordance with the present invention.

Referring now to FIGS. 4A and 4B, exemplary embodiments for producing the common mode positive and negative voltage excursions of the differential inputs is shown. In FIG. 4A, circuitry 400 for producing a positive voltage excursion of the external differential inputs is shown. FIG. 4B shows circuitry 410 for producing the negative voltage excursion of the differential inputs. Circuitry 400 and 410 may be included within the input common mode voltage and amplitude sensor 255 of the present invention and shown in FIG. 2. An advantageous aspect of an embodiment of the present invention is the ability to use circuitry 400 and 410, working off one differential input, to sense the excursions for a set of parallel differential inputs as the common mode voltage and the differential amplitude may be identical for all inputs.

Circuitry 400, shown in FIG. 4A, may include an amplifier 420 and a transistor 425, 430 coupled to each differential input, respectively. Transistors 435, 440 may be equal sized and perform as a leaker, thus each may be made with a long channel. Transistor 445 may replicate transistor 425 or transistor 430. Thus, the gate drive of transistor 445 may be identical to the positive voltage extreme (Vih) of the differential inputs driving the transistors 425, 430 acting as source followers. Circuitry 400 employs n-channel MOS devices, however in alternative embodiments, p channel MOS devices, CMOS devices, and bipolar junction transistors may be employed.

In one embodiment of the invention, a positive supply voltage 415 of VCC (approximately 2.5 Volts) is utilized for circuitry 400 similar to controlled voltage source 315 of FIG. 3. In an alternate embodiment of the invention, a positive supply voltage 415 higher than VCC may be utilized if a headroom voltage issue exists between the VCC and the differential input levels of circuitry 400. A boosted voltage may be obtained utilizing conventional charge pump circuitry.

Circuitry 410 shown in FIG. 4B may operate, in a similar fashion as circuitry 400 in FIG. 4A, to provide a negative voltage excursion of the differential inputs. Circuitry 410 includes an amplifier 480, transistors 450, 455 coupled to each of the differential inputs respectively. Transistors 450–475 may be p channel MOS devices in one embodiment of the invention. A positive supply voltage 460 of VCC and a negative supply 485 may be utilized for circuitry 410 to provide a negative voltage excursion. A pumped negative supply voltage 485 may be required in some applications if a headroom voltage issue exists. If a headroom voltage problem does not exist, negative supply voltage may represent a ground.

The voltage Vamp as shown in FIG. 2 may be produced by subtracting Vil from Vih, thus, subtracting the negative voltage excursion from the positive voltage excursion. A subtract circuit may be employed to produce Vamp utilizing active circuitry based around a high gain differential amplifier and resistor networks. It should be understood that various types of subtract circuits may be utilized in accordance with the present invention without departing from the scope and spirit of the present invention.

Figure 5:
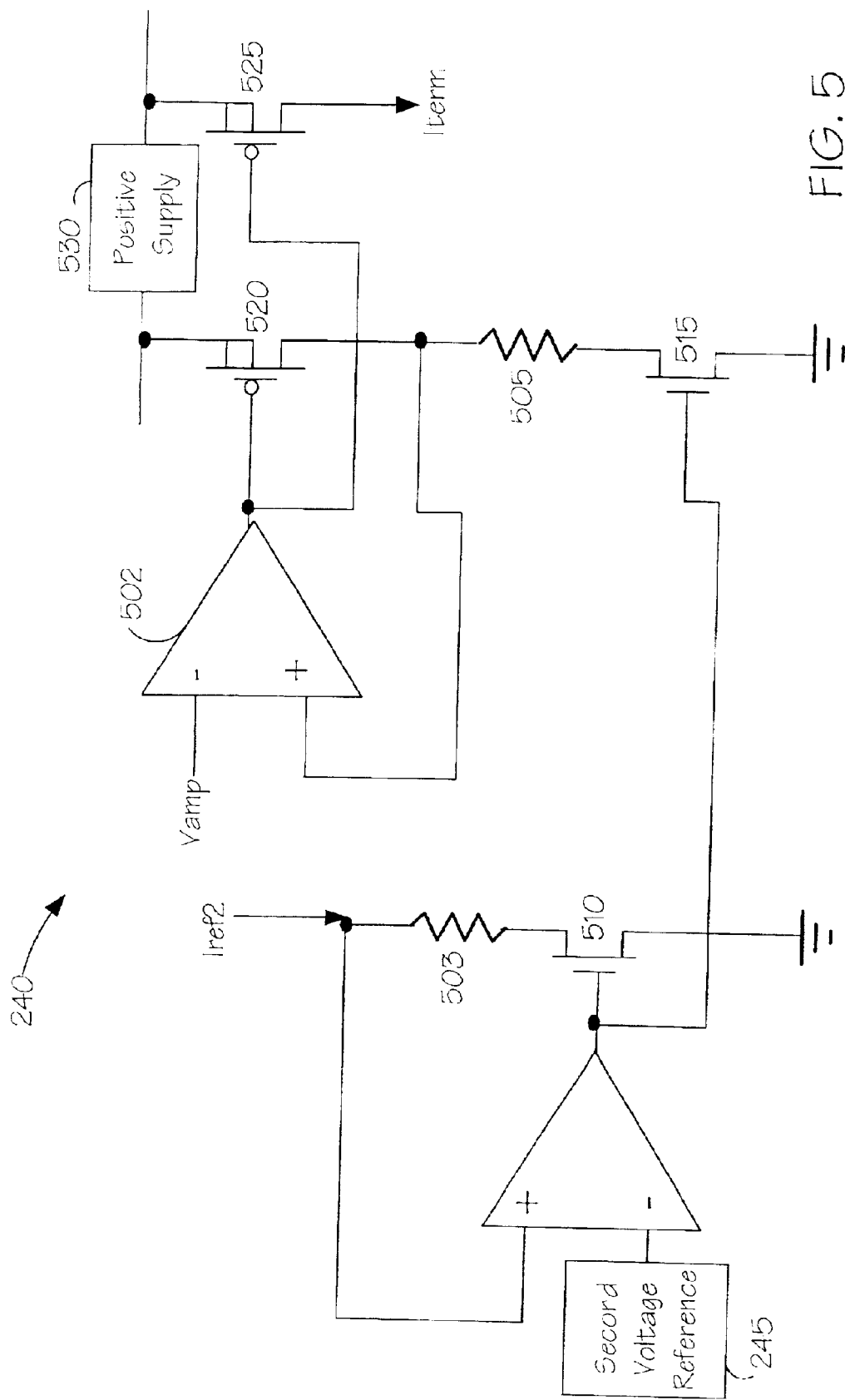
FIG. 5 depicts an exemplary embodiment of a resistor mirror and termination current generator of the present invention.

Referring to FIG. 5, an exemplary embodiment of a resistor mirror and termination current generator 240 of the present invention is shown. Resistor mirror and termination current generator 240 may include an amplifier 502 with a voltage Vamp coupled to the negative terminal. In a preferred embodiment of the invention, resistor mirror and termination current generator 240 is placed in close proximity to differential inputs 230 of FIG. 2 where the termination resistance is being implemented. Resistor mirror and termination current generator 240 may operate to produce a replica resistance of the reference resistance 210 of FIG. 2. Replica resistance includes resistor 503 and the resistance of n channel MOS transistor 510. The replica resistance may be mirrored to a mirrored resistance which includes resistor 505 and the resistance of n channel MOS transistor 515.

In one embodiment of the invention, MOS transistors 510 and 515 should be kept deep in the linear region of operation as this ensures that the transistor operates in a manner closest to a linear resistor and is most accurate for resistor mirroring. To achieve this in a practical example, the gate input of transistors 510 and 515 may be taken as high as possible in relation to their source-drain voltages. In order to prevent transistors 510 and 515 from becoming impossibly big, Iref2 may be scaled many times smaller than Iref1 in the current mirror of FIG. 3. To improve the linearity of the resistor mirroring of transistor 510 to transistor 515, resistors 503 and 505 may be selected to account for most of the termination resistance value. Scaling may occur in Iref2 to Iref1 of FIG. 3, and scaling may also occur in the value of the second voltage reference 245 of FIG. 5 to the value of the first voltage reference 220 of FIG. 2. In addition, scaling may also occur in the value of the replica resistance of resistor 503 plus transistor 510 to the value of the mirrored resistance of resistor 505 plus transistor 515.

The differential input swing amplitude (Vamp) may be placed across the mirrored resistance of resistor 505 and transistor 515. This arrangement may generate a current through transistor 520 which may be identical to or a scaled version of the desired termination resistance current Iterm. This may allow p-channel MOS transistor 520 to mirror termination current (Iterm on FIG. 5) to p-channel MOS transistor 525 for delivery to dummy termination device and gate control generator 260 of FIG. 2. In one embodiment of the invention, a positive supply voltage 530 higher than VCC may be utilized, thus the mirrored resistance may be scaled n times higher than the replica resistance to reduce the load on positive supply voltage 530. Positive supply voltage 530 may be a supply of VCC, or in an alternative embodiment, may be a voltage higher than VCC if a headroom voltage issue exists. Transistor 525 may deliver a termination current Iterm that may be n times smaller than the Iterm required. However, dummy termination device and gate control generator 260 may be scaled also to compensate for all previous scaling.

Figure 6:
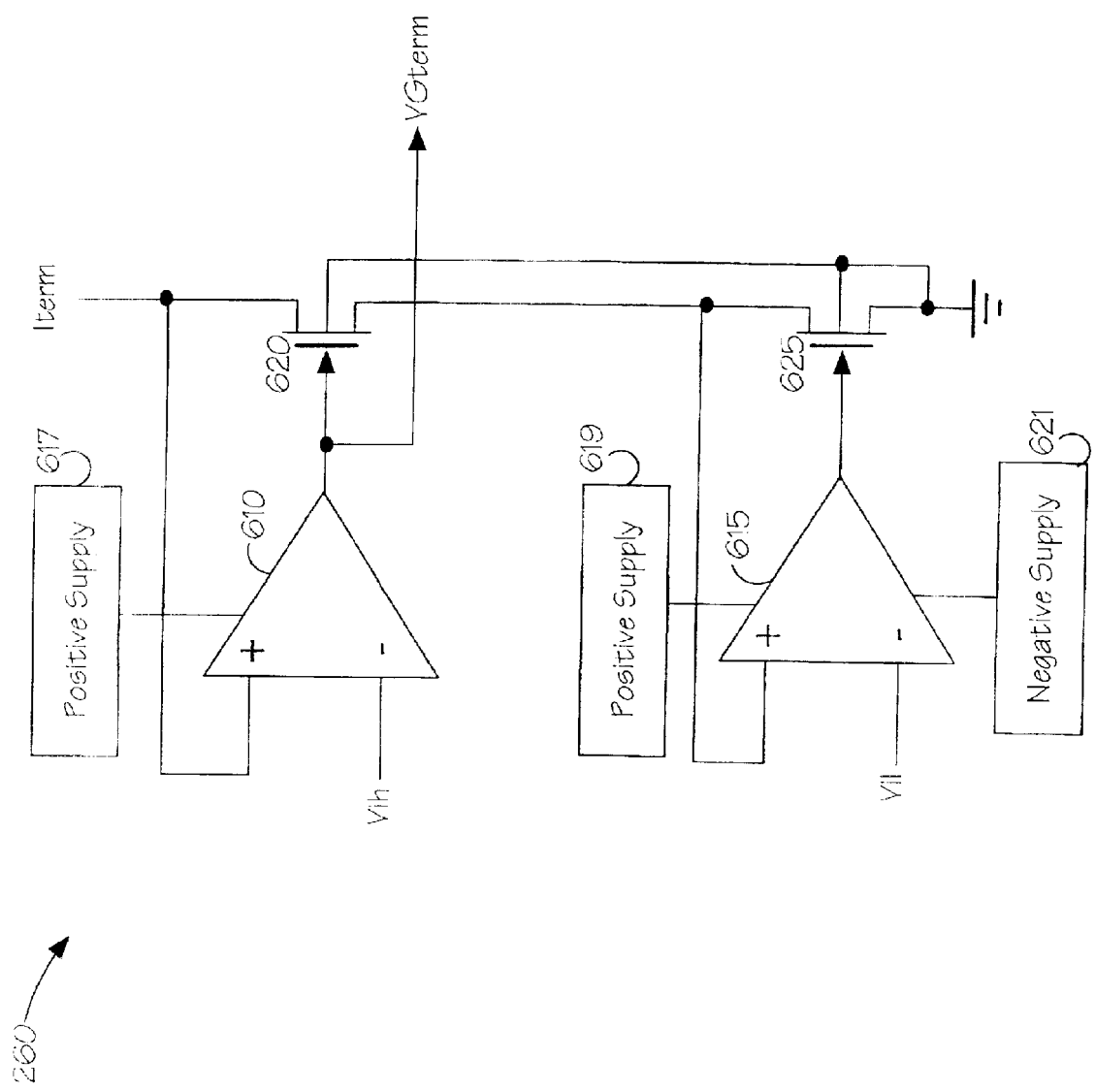
FIG. 6 depicts an exemplary embodiment of a dummy termination device and gate control generator of the present invention.

Referring now to FIG. 6, an embodiment of a dummy termination device and gate control generator 260 of the present invention is shown. Dummy termination device and gate control generator 260 may include two n-channel MOS transistors 620, 625 and two amplifiers 610, 615. First amplifier 610 may operate with a higher positive supply voltage 617 as described with respect to FIG. 4A, where second amplifier 615 may operate from a negative supply voltage 621 as described with respect to FIG. 4B. First amplifier 610 and second amplifier 615 may control the voltage levels at the drain and source of n channel MOS transistor 620 to be the positive and negative voltage excursions of the input differential signals.

The termination current Iterm produced by resistor mirror and termination current generator 240 of FIG. 2 is supplied to the drain of transistor 620, the dummy termination resistance. Iterm may be developed across a desired resistance (the mirrored resistance of FIG. 5) and with Vamp across transistor 620, the gate control of transistor 620 is the gate control required for transistor 225 to make it equal in resistance to the reference resistance 210 of FIG. 2.

If the current Iterm is scaled down n times to reduce the load on the positive supply voltage, then the device geometry of transistor 620 may be scaled to that of transistor 225 of FIG. 2 according to the same ratio. Further, the gate control of transistor 620 may maintain transistor 620 in a linear region. Thus, since Vih could be at the positive supply voltage level, the output of amplifier 610 may swing to a high of near the value of the higher positive supply voltage 617. In order to ensure this condition, amplifier 610 may operate from the higher positive supply voltage 617.

In one embodiment of the invention, dummy termination device and gate control generator 260 may supply the gate control for a transistor 225 with dynamic inputs. In an alternative embodiment, dummy termination device and gate control generator 260 may supply the gate control of a transistor with static inputs. An advantageous aspect of the dummy termination device and gate control 260 is the ability to adjust in real-time. This may provide a gate control to ensure a termination resistance that is more accurate during continuous operation. Further, apparatus 200 of the present invention may not require a refresh function during operation of the apparatus 200.

An advantageous aspect of the apparatus 200 of the present invention is the ability of the programmable termination resistance to reflect the resistance of an reference resistance throughout a differential input switching operation. This may be accomplished by maintaining transistor 225 in a linear region. In an exemplary LVDS operation, the maximum amplitude of the differential input (single-ended swing) is 400 milliVolts peak-to-peak. Thus the body-bias effect of transistor 225 may undergo a 200 milliVolt change during switching which may minimally effect the termination resistance of transistor 225.

Figure 7:
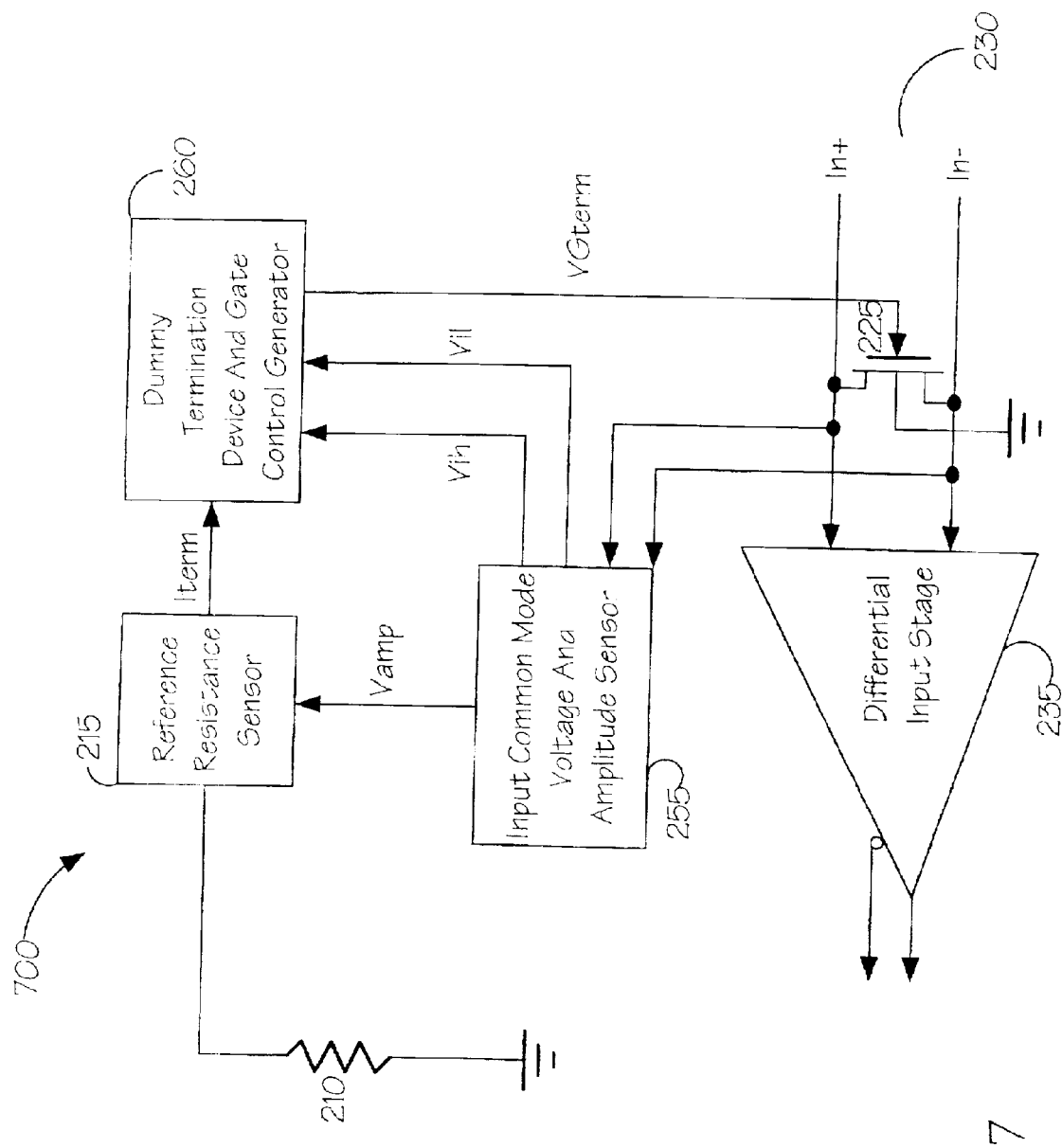
FIG. 7 depicts an alternative embodiment of an apparatus for producing a programmable on-chip resistance.

Referring now to FIG. 7, an alternative embodiment of an apparatus 700 for producing a programmable on-chip termination resistance is shown. Apparatus 700 is substantially similar to apparatus 200 of FIG. 2, however this embodiment of the invention may not require a first voltage reference 220, second voltage reference 245 and resistor mirror termination circuit 240 of FIG. 2. In this alternative embodiment of the present invention, the voltage Vamp may be inserted into amplifier 300 of the reference resistance sensor 215 as shown in FIG. 3. This may produce a current Iterm to dummy termination device and gate control generator 260. Input common mode voltage and amplitude sensor 255 and dummy termination device and gate control generator 260 operate in a similar fashion as described with respect to FIG. 2 to produce a programmable on-chip resistance based upon the detected resistance of reference resistance 210. In this alternative embodiment, it may be preferable to place reference resistance 210 close to a single set of differential inputs 130 to remove a mirroring requirement.

It should be understood by those with ordinary skill in the art that FIGS. 2–7 describe embodiments of circuitry to produce a programmable on-chip resistance. Yet, other devices and circuitry may be utilized to achieve a similar result without departing from the scope and spirit of the present invention. For example, other types of transistors may be employed than those disclosed in the description including both n channel and p channel MOS devices, CMOS devices, and bipolar junction transistors.

Further, although the invention has been described with a certain degree of particularity, it should be recognized that elements thereof may be altered by persons skilled in the art without departing from the spirit and scope of the invention. It is believed that the method and apparatus for the present invention and many of its attendant advantages will be understood by the foregoing description, and it will be apparent that various changes may be made in the form, construction, and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A method for producing a programmable on-chip resistance, comprising:
   (a) detecting a resistance value of a reference resistance;
   (b) determining a set of voltage excursions for a set of differential inputs; said set of voltage excursions being utilized to determine a differential input swing amplitude voltage;
   (c) producing a desired current by placing said differential input swing amplitude voltage across a device with said resistance value; and
   (d) directing said desired current to an intermediate termination device, wherein a control voltage acquired from said intermediate termination device is capable of controlling a termination resistance.

2. The method as claimed in claim 1, wherein said termination resistance is located on a chip.

3. The method as claimed in claim 2, wherein said reference resistance is located off said chip.

4. The method as claimed in claim 2, wherein said reference resistance is located on said chip.

5. The method as claimed in claim 2, wherein said device is said reference resistance.

6. The method as claimed in claim 2, wherein said device is not said reference resistance.

7. The method as claimed in claim 2, wherein said termination resistance is substantially equal to said resistance value of said reference resistance.

8. The method as claimed in claim 2, wheein said termination resistance is substantially equal to a scaled replica of said resistance value of said reference resistance.

9. The method as claimed in claim 2, wherein said termination resistance is produced by a transistor, said control voltage being applied to a terminal of said transistor to control a resistance of said termination resistance.

10. The method as claimed in claim 2, wherein said differential input swing amplitude voltage is derived by subtracting a negative voltage excursion from a positive voltage excursion.

11. An apparatus comprising:
    (a) means for determining a set of voltage excursions from a set of differential inputs;
    (b) means for subtracting coupled to said determining means, said subtracting means producing a differential input swing amplitude voltage from said set of voltage excursions;
    (c) means for detecting a resistance of a reference resistance, said detecting means producing a reference current;
    (d) means for producing a desired current, said producing means receiving said reference current and placing said differential input swing amplitude voltage from said subtracting means across a device with a resistance value substantially equal to said resistance of said reference resistance; and
    (e) means for directing said desired current to an intermediate termination device, said intermediate termination device receiving said desired current and said set of voltage excursions to create a control voltage capable of controlling a termination resistance.

12. The apparatus as claimed in claim 11, wherein said apparatus is placed on a chip and said reference resistance is located off said chip.

13. The apparatus as claimed in claim 11, wherein said termination resistance is substantially equal to said resistance of said reference resistance.

14. The apparatus as claimed in claim 11, wherein said termination resistance is substantially equal to a scaled replica of said resistance of said reference resistance.

15. The apparatus as claimed in claim 11, wherein said termination resistance is produced by a transistor, said control voltage being applied to a terminal of said transistor to control a resistance of said termination resistance.

\* \* \* \* \*

UNITED STATES PATENT AND TRADEMARK OFFICE
CERTIFICATE OF CORRECTION

PATENT NO. : 6,826,734 B1
DATED : November 30, 2004
INVENTOR(S) : Murray

It is certified that error appears in the above-identified patent and that said Letters Patent is hereby corrected as shown below:

Column 4,
Line 6, replace "Irej2. In one" with -- Iref2. In one. --; and replace "Irej2 may be" with -- Iref2 may be --.
Line 14, replace "current Irej2." with -- current Iref2. --.

Column 8,
Line 4, replace "wheein said" with -- wherein said --.
Line 11, replace "claimed in claim 2" with -- claimed in claim 1 --.
Line 14, replace "substracting a negative" with -- subtracting a negative --.
Line 16, replace "An apparatus comprising" with -- An apparatus, comprising --.

Signed and Sealed this

Twenty-eighth Day of February, 2006

JON W. DUDAS
*Director of the United States Patent and Trademark Office*